(12) United States Patent
Kim

(10) Patent No.: US 8,143,677 B2
(45) Date of Patent: Mar. 27, 2012

(54) TRANSISTOR, A TRANSISTOR ARRANGEMENT AND METHOD THEREOF

(75) Inventor: Myoung-Soo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 46 days.

(21) Appl. No.: 12/659,107

(22) Filed: Feb. 25, 2010

(65) Prior Publication Data

US 2010/0155856 A1    Jun. 24, 2010

Related U.S. Application Data

(62) Division of application No. 11/802,004, filed on May 18, 2007, now Pat. No. 7,696,054.

(30) Foreign Application Priority Data

May 30, 2006  (KR) .................. 10-2006-0048947

(51) Int. Cl.
    *H01L 29/76*  (2006.01)
    *H01L 29/94*  (2006.01)
    *H01L 31/062* (2006.01)
    *H01L 31/113* (2006.01)
    *H01L 31/119* (2006.01)

(52) U.S. Cl. .............. 257/392; 257/408; 257/E27.06; 257/E29.266

(58) Field of Classification Search .......... 257/392, 257/408, E27.06, E29.266
See application file for complete search history.

(56) References Cited

U.S. PATENT DOCUMENTS

| 5,969,396 | A | 10/1999 | Iwasa et al. |
| 6,136,616 | A | 10/2000 | Fulford et al. |
| 2002/0182757 | A1 | 12/2002 | Conchieri et al. |
| 2005/0104123 | A1 | 5/2005 | Kim et al. |
| 2005/0121726 | A1 | 6/2005 | Asada et al. |
| 2006/0027880 | A1 | 2/2006 | Taya |

FOREIGN PATENT DOCUMENTS

| JP | 2000-012711 | 1/2000 |
| JP | 2004-241710 | 8/2004 |
| KR | 10-0196288 | 2/1999 |
| KR | 1999-0081292 | 11/1999 |
| KR | 10-1999-0084601 | 12/1999 |
| KR | 10-1999-0086534 | 12/1999 |
| KR | 10-2004-0078786 | 12/1999 |
| KR | 10-2004-0073939 | 8/2004 |
| KR | 10-2005-0048113 | 5/2005 |
| KR | 10-2006-0054577 | 5/2006 |

*Primary Examiner* — David S Blum

(74) *Attorney, Agent, or Firm* — Harness, Dickey & Pierce, P.L.C.

(57) ABSTRACT

A transistor, transistor arrangement and method thereof are provided. The example method may include determining whether a gate width of the transistor has been adjusted; and adjusting a distance between a higher-concentration impurity-doped region of the transistor and a device isolation layer of the transistor based on the adjusted gate width if the determining step determines the gate width of the transistor is adjusted. The example transistor may include a first device isolation layer defining a first active region, a first gate line having a first gate width and crossing over the first active region, a first lower-concentration impurity-doped region formed in the first active region at first and second sides of the first gate line and a first higher-concentration impurity-doped region formed in the lower-concentration impurity-doped region and not in contact with the gate line and the device-isolation layer.

8 Claims, 4 Drawing Sheets

TRANSISTOR, A TRANSISTOR ARRANGEMENT AND METHOD THEREOF

CROSS-REFERENCE TO RELATED APPLICATIONS

This application is a divisional of U.S. application Ser. No. 11/802,004, now U.S. Pat. No. 7,696,054, filed May 18, 2007, which claims priority under 35 U.S.C. §119 to Korean Patent Application No. 2006-48947 filed on May 30, 2006. The entire contents of all of these applications are incorporated herein by reference.

PRIORITY STATEMENT

This application claims the benefit of Korean Patent Application No. 2006-48947, filed on May 30, 2006, in the Korean Intellectual Property Office, the entire contents of which are incorporated herein by reference.

BACKGROUND OF THE INVENTION

1. Field of the Invention

Example embodiments of the present invention relate generally to a transistor, transistor arrangement and method thereof.

2. Description of the Related Art

Semiconductor devices may include one or more transistors each having one of a plurality of sizes, and which may be driven by one of a plurality of voltages. Higher-voltage transistors may generally be driven by higher voltages and may include thicker gate insulation layers. Source/drain regions of the higher-voltage transistors may employ a lightly doped drain (LDD) structure having a lower-concentration impurity-doped region and a higher-concentration impurity-doped region in order to reduce punchthrough and increase breakdown voltage characteristics.

However, in order to implement higher-voltage transistors within products such as semiconductor devices, the higher-voltage transistor may be configured to have a given size so as to conform to a desired physical layout. Typical transistor design characteristics may include a gate length and a gate width, respectively, of a transistor gate. A higher-voltage transistor may have typically have a constant gate length, and the higher-voltage transistor may generally be adjusted via changes to the gate width only.

Conventional higher-voltage transistors may be configured to maintain a relatively constant resistance per a unit length of a gate width. Thus, while different conventional higher-voltage transistors may include different gate widths, the different higher-voltage transistors may be desired to have identical and/or substantially similar characteristics. However, conventional higher-voltage transistors may have different respective resistances per a unit length of a gate width if sizes (e.g., gate widths) of the respective transistors are changed (e.g., to accommodate a desired physical layout).

SUMMARY OF THE INVENTION

An example embodiment of the present invention is directed to a method of configuring a transistor, including determining whether a gate width of the transistor has been adjusted; and adjusting a distance between a higher-concentration impurity-doped region of the transistor and a device isolation layer of the transistor based on the adjusted gate width if the determining step determines the gate width of the transistor is adjusted.

Another example embodiment of the present invention is directed to a transistor, including a first device isolation layer defining a first active region, a first gate line having a first gate width and crossing over the first active region, a first lower-concentration impurity-doped region formed in the first active region at first and second sides of the first gate line and a first higher-concentration impurity-doped region formed in the lower-concentration impurity-doped region and not in contact with the gate line and the device-isolation layer.

Another example embodiment of the present invention is directed to a method of designing a higher-voltage transistor whose resistance per a unit length of a gate width is substantially constant irrespective to a change of a gate width of the higher-voltage transistor.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS

Figure 1:
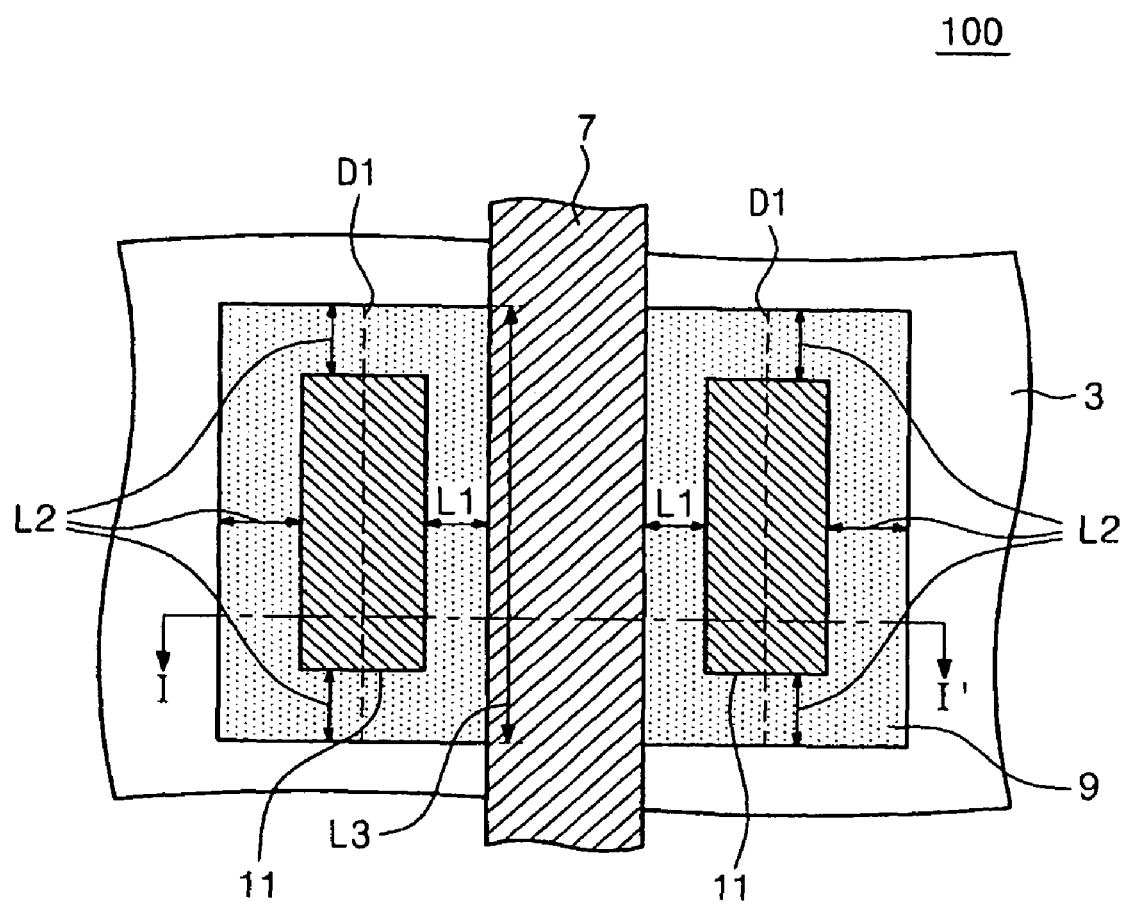
FIG. 1 is a plan view illustrating a higher-voltage transistor according to an example embodiment of the present invention.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the Figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
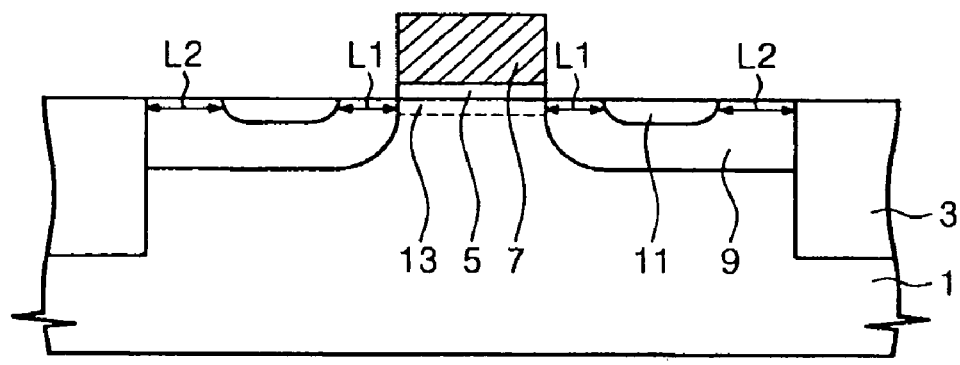
FIG. 2 is a sectional view taken by cutting FIG. 1 along I-I' line.

FIG. 1 is a plan view illustrating a higher-voltage transistor according to an example embodiment of the present invention. FIG. 2 is a sectional view taken by cutting FIG. 1 along I-I' line.

In the example embodiment of FIGS. 1 and 2, a first higher-voltage transistor 100 may include a semiconductor substrate 1. A device isolation layer 3 may be disposed on the semiconductor substrate 1 to define an active region. The semiconductor substrate 1 may be doped with P-type impurities, for example. Although not shown in FIGS. 1 and/or 2, a well may be disposed in the semiconductor substrate 1. A gate insulation layer 5 may be disposed on the semiconductor substrate 1. A first gate line (e.g., or a "gate electrode") 7 may be disposed on the gate insulation layer 5. In an example, the gate insulation layer 5 may be include a thermal oxide and may have a thickness sufficient to endure a higher voltage. The first gate line 7 may include a conductive material, such as a metal-containing layer or a polysilicon doped by impurities. Although not shown in FIGS. 1 and/or 2, a capping layer may be disposed on the first gate line 7. A first lower-concentration impurity-doped region 9 may be disposed in the semiconductor substrate 1 at first and second sides of the first gate line 7, A first higher-concentration impurity-doped region 11 may be disposed in the first lower-concentration impurity-doped region 9. The first higher-concentration impurity-doped region may be spaced apart from the first gate line 7 by a first distance L1 and from the device isolation 3 by a second distance L2. The first distance L1 and the second distance L2 may be greater than a given threshold distance (e.g., greater than zero) so as to reduce or prevent an occurrence of a punchthrough or leakage current and/or for improving a breakdown voltage characteristic. In an example, the given threshold distance may be in the range 0.1~10 μm. The gate line 7 of the first higher-voltage transistor 100 may include a first gate width L3. In an example, the first higher-voltage transistor 100 may be operated with an operation voltage between 3.3V~50V.

In the example embodiment of FIGS. 1 and 2, the second distance L2 may be determined based on the first gate width L3. For example, based on the first gate width L3, it may be possible to determine 2×L2, which may be a sum of lengths of the first lower-concentration impurity-doped region 9 overlapping with a straight line D1 that is parallel to the gate line 7 and crossing over the first lower-concentration impurity-doped region 9, and the first higher-concentration impurity-doped region 11. For example, if the first gate width L3 is tripled, the second distance L2 may likewise be tripled. Alternatively, if the first gate width L3 is reduced by half, the second L2 may be reduced by half, and so on.

Figure 3:
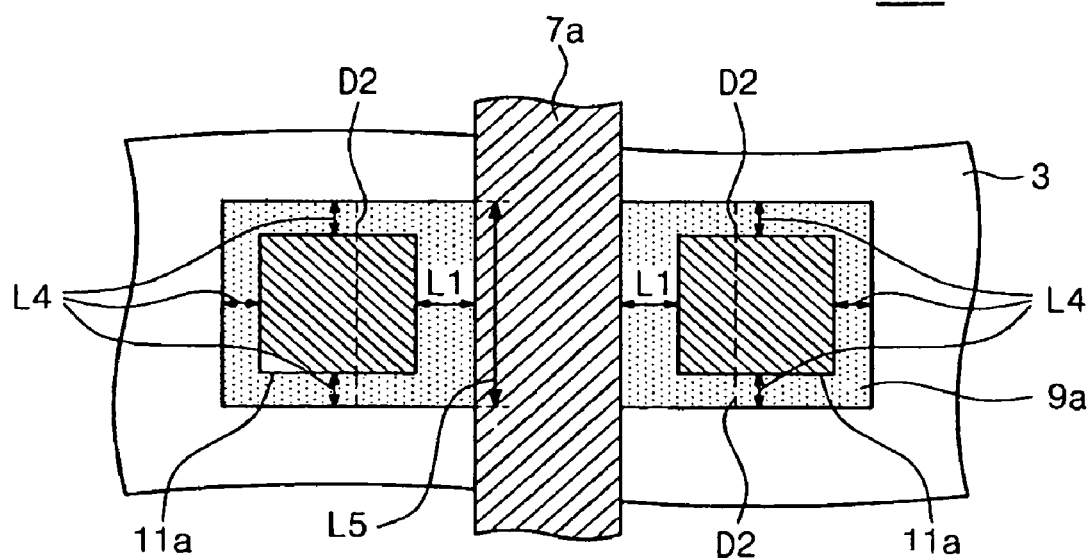
FIG. 3 is a plan view illustrating a higher-voltage transistor according to another example embodiment of the present invention.

FIG. 3 is a plan view illustrating a higher-voltage transistor according to another example embodiment of the present invention.

In the example embodiment of FIG. 3, a second higher-voltage transistor 200 may include a device isolation layer 3, a second gate line 7a, a second lower-concentration impurity-doped region 9a and a second higher-concentration impurity-doped region 11a. The second gate line 7a may have a second gate width L5. The second higher-concentration impurity-doped region 11a may be spaced apart from the second gate line 7a by a first distance L1 and from the device isolation layer 3 by a third distance L4.

In the example embodiments of FIGS. 1, 2 and 3, in an example, the second gate width L5 may correspond to half of the first gate width L3, and the third distance L4 may correspond to half of the second distance L2. In another example, the types and dose amounts of impurities doped in the first higher-concentration impurity-doped region 11 may be substantially similar (e.g., identical) to those doped in the second higher-concentration impurity-doped region 11a. In another example, the types and dose amounts of impurities doped in the first lower-concentration impurity-doped region 9 may be substantially similar (e.g., identical) to those doped in the second lower-concentration impurity-doped region 9a.

In the example embodiment of FIGS. 1 and 2, in the first higher-voltage transistor 100, a resistance per a unit length of the first lower-concentration impurity-doped region 9 adjacent to the first gate line 7 may be calculated as follows:

$$\frac{R_1(L3-2L2)+R_2(L2+L2)}{L3} \qquad \text{Equation 1}$$

In the example embodiment of FIG. 3, in the second higher-voltage transistor 200, a resistance per a unit length of the second lower-concentration impurity-doped region 9a adjacent to the second gate line 7a may be calculated as follows:

$$\frac{R_1(L5-2L4)+R_2(L4+L4)}{L5}, \qquad \text{Equation 2}$$

In Equations 1 and 2, $R_1$ may correspond to resistances of the lower-concentration impurity-doped regions 9 and 9a located between the gate lines 7 and 7a and the higher-concentration impurity-doped regions 11 and 11a, and $R_2$ may correspond to resistances of the lower-concentration impurity-doped regions 9 and 9a located at edges of the higher-concentration impurity-doped regions 11 and 11a.

In an example, referring to equation 2, if L5 is equal to half of L3 and L4 is equal to half of L2, Equation 2 may be reduced to Equation 1. Therefore, during an operation of the transistors 100 and 200 of FIGS. 1, 2 and 3, respectively, a resistance per a unit length of the first gate width L3, which may be applied to the first lower-concentration impurity-doped region 9 adjacent to the first gate line 7 of the first higher voltage transistor 100, may be equal to a resistance per a unit length of the second gate width L5, which may be applied to the second lower-concentration impurity-doped region 9a adjacent to the second gate line 7a of the second higher voltage transistor 200.

In the example embodiment of FIG. 3, the second high-voltage transistor 200 may be a unit higher-voltage transistor or a sub higher-voltage transistor. The higher-voltage transistor 200 may be modified by arranging a plurality of the unit and/or sub higher-voltage transistor to a given active region jointly in a vertical or/and horizontal direction, as will now be explained in greater detail with respect to the example embodiment of FIG. 4.

Figure 4:
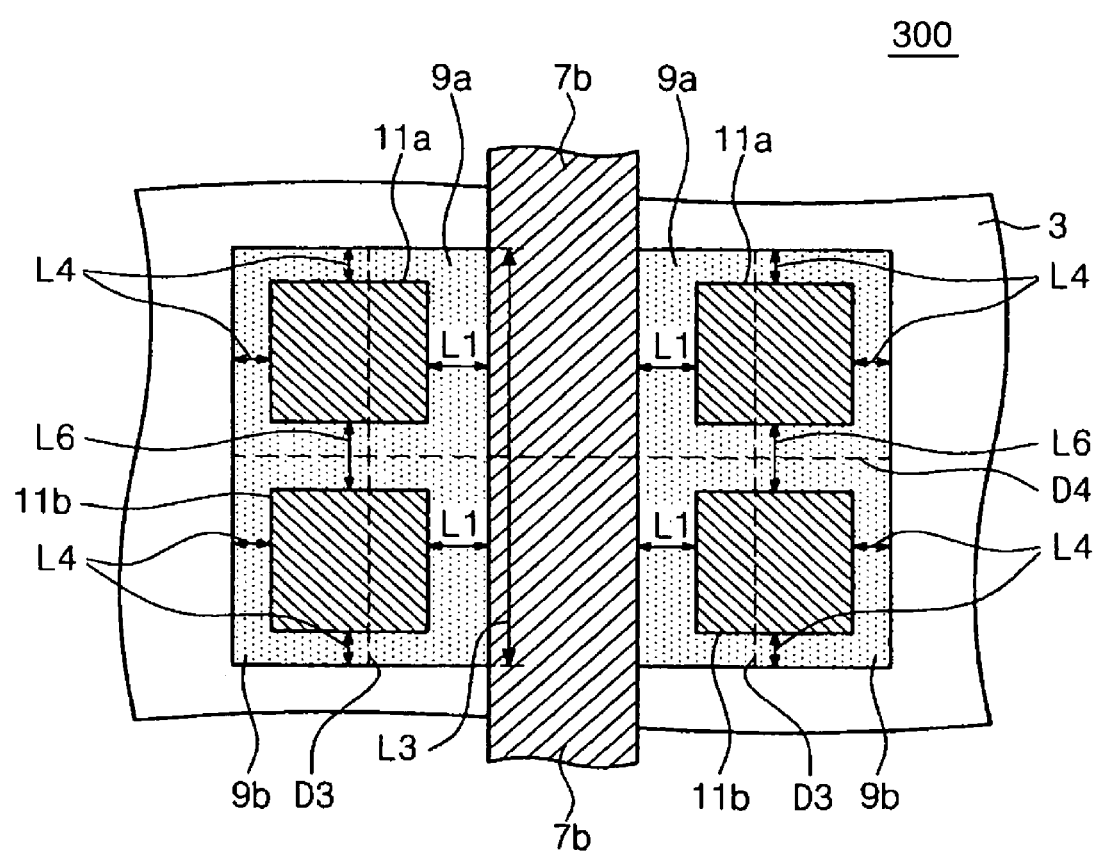
FIG. 4 is a plan view illustrating a higher-voltage transistor according to another example embodiment of the present invention.
Figure 5:
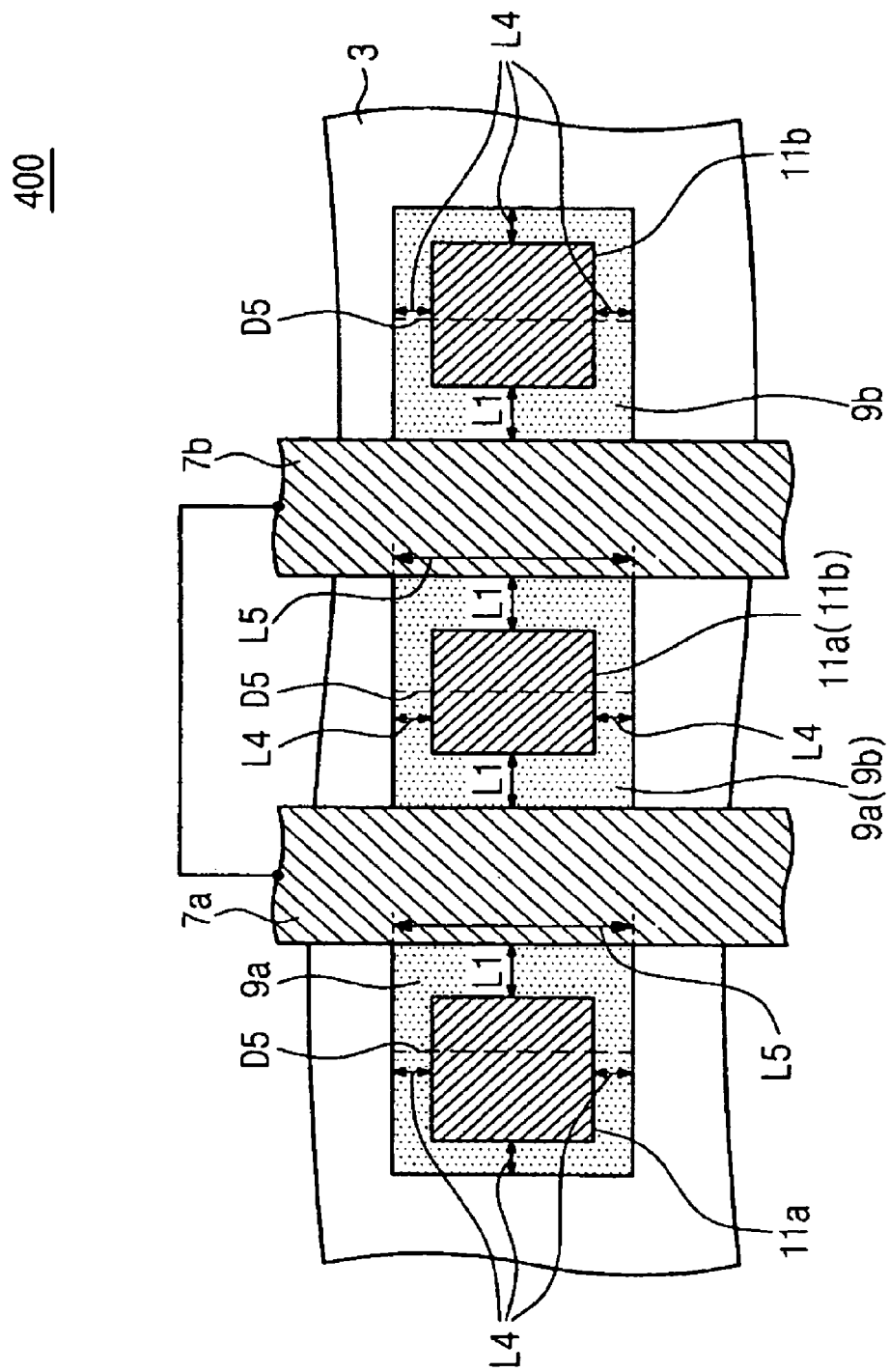
FIG. 5 is a plan view illustrating a higher-voltage transistor according to another example embodiment of the present invention.

FIG. 4 is a plan view illustrating a higher-voltage transistor according to another example embodiment of the present invention. FIG. 5 is a plan view illustrating a higher-voltage transistor according to another example embodiment of the present invention.

In the example embodiment of FIG. 4, a third higher-voltage transistor 300 may be formed by arranging two of the second higher-voltage transistors 200 to a given active region jointly in a vertical direction. For example, the third higher-voltage transistor 300 may be symmetrical to a straight line D4 crossing a center of gate lines 7a and 7b. Lower-concentration impurity-doped regions 9a and 9b and higher-concentration impurity-doped regions 11a and 11b may be arranged at first and second sides of the gate lines 7a and 7b. The higher-concentration impurity-doped regions 11a and 11b may be spaced apart from the gate lines 7a and 7b as a first distance L1 and from the device isolation layer 3 as a third distance L4. At a given side of the gate lines 7a and 7b, the higher-concentration impurity-doped regions 11a and 11b may be spaced apart from each other by a fourth distance L6. In an example, the fourth distance L6 may be substantially equal to a double of the third distance L4. In another example, a whole gate width of the gate lines 7a and 7b may be substantially equal to the first gate width L3 of the first higher-voltage transistor 100 of FIG. 1. In an example, a sum of lengths of the lower-concentration impurity-doped regions 9a and 9b overlapping with a straight line D3, which may be parallel to the gate lines 7a and 7b and crossing over the higher-concentration impurity-doped regions 11a and 11b and the lower-concentration impurity-doped regions 9a and 9b, may be expressed as 2L4+L6, and the sum may be equal to 2×L2 (e.g., see FIG. 1).

In the example embodiment of FIG. 4, because the third higher-voltage transistors 300 may be formed by arranging two of the second high-voltage transistors 200 and a resistance per a unit length of a gate width of the second high-voltage transistor 200 may be substantially equal to that of the first higher-voltage transistor 100 (e.g., see Equations 1 and 2), a resistance per a unit length of a gate width of the third higher-voltage transistor 300 may be configured to be substantially equal to that of the first higher-voltage transistor 100.

In the example embodiment of FIG. 5, a fourth higher-voltage transistor 400 may be formed by arranging two of the second higher-voltage transistor 200 within a given active region jointly in a horizontal direction. For example, the fourth higher-voltage transistor 400 may be symmetrical to a straight line D5 located between two gate lines 7a and 7b. The gate lines 7a and 7b may be electrically connected to each other. Like the third higher-voltage transistor 300, the fourth higher-voltage transistor 400 may be configured to have substantially the same resistance per a unit length of a gate width as the first higher-voltage transistor 100. Thus, the first, second, third and fourth higher-voltage transistors 100, 200, 300 and 400 may have substantially the same resistance per a unit length of a gate width irrespective of their different forms and/or sizes. Therefore, in another example the first, second, third and fourth higher-voltage transistors 100, 200, 300 and 400 may be configured to have a relatively equivalent performance.

In another example embodiment of the present invention, higher-voltage transistors may be configured to have a given resistance per a unit length of a gate width based on controlling or adjusting a distance between a higher-concentration impurity-doped region and a device isolation layer. In an example, the adjusted distance may be based on a gate width. For example, adjusting (e.g., increasing or decreasing) the sum of lengths of lower-concentration impurity-doped regions overlapping with a straight line, which may be parallel to the gate line and crossing over the lower-concentration impurity-doped region and the higher-concentration impurity-doped region, may be performed based on a ratio of increasing or decreasing a gate width. Higher-voltage transistors may thereby be produced to have desired properties irrespective of physical design characteristics, such as a size or form of the higher-voltage transistor, thereby allowing design engineers greater flexibility with regard to transistor implementation. Accordingly, an efficiency of a semiconductor design process may be increased.

Example embodiments of the present invention being thus described, it will be obvious that the same may be varied in many ways. For example, while example embodiments of the present invention are above-described as directed to higher-voltage transistors, it is understood that "higher-voltage" is a relative term, and may vary from application to application. Accordingly, the above-described example embodiments of the present invention may generally be directed to transistors having any voltage characteristics, and are not intended to be limited to what a "higher-voltage" transistor may qualify as within any particular application.

Such variations are not to be regarded as a departure from the spirit and scope of example embodiments of the present invention, and all such modifications as would be obvious to one skilled in the art are intended to be included within the scope of the following claims.

What is claimed is:

1. A transistor arrangement, comprising:
   a simulation higher-voltage transistor including
      a first device isolation layer defining a first active region,
      a first gate line having a first gate width and crossing over the first active region,
      a first lower-concentration impurity-doped region formed in the first active region at first and second sides of the first gate line, and
      a first higher-concentration impurity-doped region formed in the lower-concentration impurity-doped region and not in contact with the first gate line and the first device isolation layer; and
   a standard higher-voltage transistor including a standard device isolation layer defining a standard active region, a standard gate line having a standard gate width and crossing over the standard active region, a standard lower-concentration impurity-doped region formed in the standard active region at first and second sides of the standard gate line and a standard higher-concentration impurity-doped region formed in the standard lower-concentration impurity-doped region and not in contact with the standard gate line and the standard device isolation layer, wherein the first higher-concentration impurity-doped region includes at least two sub higher-concentration impurity-doped regions, wherein the first gate line includes at least two sub gate lines having sub gate widths, and wherein the sub gate lines are electrically connected to each other and the first gate width is substantially equal to a multiplication product of a number of the sub gate lines and the sub gate width.

2. The transistor arrangement of claim 1, wherein the standard gate width and the first gate width are substantially the same, and wherein a sum of lengths of the standard lower-concentration impurity-doped region overlapping with a standard straight line which is parallel to the standard gate line and crossing over the standard lower-concentration impurity-doped region and the standard higher-concentration impurity-doped region is substantially the same as a sum of lengths of the first lower-concentration impurity-doped region overlapping with a first straight line which is parallel to the first gate line and crossing over the first lower-concentration impurity-doped region and the first higher-concentration impurity-doped region.

3. The transistor arrangement of claim 1, wherein the at least two sub higher-concentration impurity-doped regions are not in contact with each other and positioned at a given side of the first gate line.

4. A transistor arrangement, comprising:
a first higher-voltage transistor including
a first device isolation layer defining a first active region,
a first gate line having a first gate width and crossing over the first active region,
a first lower-concentration impurity-doped region formed in the first active region at first and second sides of the first gate line, and
a first higher-concentration impurity-doped region formed in the lower-concentration impurity-doped region and not in contact with the first gate line and the first device isolation layer; and
a second higher-voltage transistor including a second device isolation layer defining a second active region, a second gate line having a second gate width and crossing over the second active region, a second lower-concentration impurity-doped region formed in the second active region at first and second sides of the second gate line and a second higher-concentration impurity-doped region formed in the second lower-concentration impurity-doped region and not in contact with the second gate line and the second device isolation layer,
wherein the second lower-concentration impurity-doped region includes at least two sub lower-concentration impurity-doped regions at first and second sides of the sub gate line,
wherein the second higher-concentration impurity-doped region includes at least two sub higher-concentration impurity-doped regions formed in the sub lower-concentration impurity-doped region are not in contact with the sub gate line and the second device isolation layer,
wherein the second gate line includes at least two sub gate lines having sub gate widths, and
wherein the sub gate lines are electrically connected to each other and the second gate width is substantially equal to a multiplication product of a number of the sub gate lines and the sub gate width.

5. The transistor arrangement of claim 4, wherein a ratio of the first gate width to the second gate width is substantially equal to a ratio of a sum of lengths of the first lower-concentration impurity-doped region overlapping with the a first straight line which is parallel to the first gate line and crossing over the first lower-concentration impurity-doped region and the first higher-concentration impurity-doped region to a sum of lengths of the second lower-concentration impurity-doped region overlapping a second straight line which is parallel to the second gate line and crossing over the second lower-concentration impurity-doped region and the second higher-concentration impurity-doped region.

6. The transistor arrangement of claim 4, wherein at least two sub higher-concentration impurity-doped regions are not in contact with each other in the second active region at a given side of the second gate line.

7. The transistor arrangement of claim 4, wherein a sum of lengths of the second lower-concentration impurity-doped region overlapping with the second straight line which is parallel to the second gate line and crossing over the second lower-concentration impurity-doped region and the second higher-concentration impurity-doped region is substantially equal to a multiplication product of a number of the sub gate lines and a sum of lengths of the sub lower-concentration impurity-doped regions overlapping a sub straight line which is parallel to the sub gate line and crossing over the sub lower-concentration impurity-doped region and the sub higher-concentration impurity-doped region.

8. A transistor arrangement, comprising:
a first higher-voltage transistor including
a first device isolation layer defining a first active region,
a first gate line having a first gate width and crossing over the first active region,
a first lower-concentration impurity-doped region formed in the first active region at first and second sides of the first gate line, and
a first higher-concentration impurity-doped region formed in the lower-concentration impurity-doped region and not in contact with the first gate line and the first device isolation layer; and
a second higher-voltage transistor including a second device isolation layer defining a second active region, a second gate line having a second gate width and crossing over the second active region, a second lower-concentration impurity-doped region formed in the second active region at first and second sides of the second gate line and a second higher-concentration impurity-doped region formed in the second lower-concentration impurity-doped region and not in contact with the second gate line and the second device isolation layer,
wherein a ratio of the first gate width to the second gate width is substantially equal to a ratio of a sum of lengths of the first lower-concentration impurity-doped region overlapping with the a first straight line which is parallel to the first gate line and crossing over the first lower-concentration impurity-doped region and the first higher-concentration impurity-doped region to a sum of lengths of the second lower-concentration impurity-doped region overlapping a second straight line which is parallel to the second gate line and crossing over the second lower-concentration impurity-doped region and the second higher-concentration impurity-doped region, and
wherein the first gate width is different from the second gate width.

* * * * *